United States Patent [19]

Yamashita et al.

[11] Patent Number: 4,614,933

[45] Date of Patent: Sep. 30, 1986

[54] VITERBI DECODER WITH THE PIPELINE PROCESSING FUNCTION

[75] Inventors: Atsushi Yamashita; Tadayoshi Katoh, both of Kawasaki; Hiroshi Kurihara, Tokyo, all of Japan

[73] Assignee: Fujitsu Limited, Kawasaki, Japan

[21] Appl. No.: 701,504

[22] Filed: Feb. 14, 1985

[30] Foreign Application Priority Data

Feb. 20, 1984 [JP] Japan .............................. 59-028488

[51] Int. Cl.$^4$ ........................................... H03K 13/24
[52] U.S. Cl. ........................................... 340/347 DD
[58] Field of Search ................... 340/347 DD; 371/43

[56] References Cited

U.S. PATENT DOCUMENTS 3,789,360 1/1974 Clark, Jr. et al. ..................... 371/43
4,240,156 12/1980 Doland ................................. 371/43

OTHER PUBLICATIONS

Heller et al, "Vertibi Decoding for Satellite and Space Communication", *IEEE Transactions on Comm. Tech.*, vol. COM-19, No. 5, Oct. 1971, pp. 835-848.

*Primary Examiner*—William M. Shoop, Jr.
*Assistant Examiner*—Sharon D. Logan
*Attorney, Agent, or Firm*—Staas & Halsey

[57] ABSTRACT

A Viterbi decoder with a pipeline processing function for decoding a received code sequence transferred from an encoder, including correlation determining circuit for calculating correlation between a received code sequence and each of a plurality of predetermined code sequences of known allowable transitions; and selecting circuits operatively receiving the correlations for selecting one of the predetermined code sequences as the maximum likelihood transition. The selected one of the predetermined code sequences has the maximum correlation among the correlations. A decoded code sequence is obtained from the selected one of the predetermined code sequences. The correlation determining circuit includes a plurality of new correlation determining circuits each for determining a new correlation based on newly received code sequence and an aready calculated correlation between the already received code sequence and one of the predetermined code sequences; and a comparing circuit for comparing, simultaneously with the determination of the new correlations, already calculated correlations between the already received code sequence and the predetermined code sequences, so as to output a path selecting data. The selecting circuits selects, in response to the selecting data, one of the predetermined code sequences as the maximum likekihood sequence with respect to the code sequence generated by the encoder.

6 Claims, 16 Drawing Figures

VITERBI DECODER WITH THE PIPELINE PROCESSING FUNCTION

BACKGROUND OF THE INVENTION (1) Field of the Invention

The present invention relates to a Viterbi decoder with a pipeline processing function which performs maximum likelihood decoding of convolutional codes with an improved throughput.

(2) Description of the Related Art

A Viterbi algorithm is well known as a powerful, reliable technique for decoding convolutional codes and is widely used in, for example, satellite communications.

The principles of Verterbi decoding are described in, for example, IEEE TRANSACTIONS ON COMMUNICATIONS TECHNOLOGY, Vol. COM-19, No. 5, OCTOBER 1971 "Convolutional Codes and Their Performance in Communication Systems" A. J. VITERBI. A Viterbi decoder is disclosed in Japanese Unexamined Patent Publication (Kokai) No. 59-19455, published on Jan. 31, 1984.

As is well known and as will be described in detail later, a conventional Viterbi decoder has calculating circuits each having adders for adding "path metrics" and "branch metrics" to obtain new path metrics (path metrics and branch metrics are defined later); a comparator for comparing the new path metrics, and a selector for selecting one of the new path metrics to be output in response to the output of the comparator.

Adding operations to obtain the new path metrics and the comparing operation of the new path metrics are conventionally carried out within one clock cycle period. The clock cycle period is therefore substantially determined by the operating speeds of the adders and the comparator. In other words, the clock cycle period should be more than the adding time plus the comparing time. This results in low throughput of the Viterbi decoder.

Also, the clock signal is commonly used both for the Viterbi decoder and for its peripheral circuits. The clock cycle period determined by the Viterbi decoder is longer than the clock cycle period for the peripheral circuits when they operate independently. This results in lower speeds for the overall circuit.

To overcome this problem, if the peripheral circuits are formed by, for example, transistor-transistor logic circuits (TTL circuits), then the Viterbi decoder should be formed by emitter-coupled logic (ECL) circuits, which have a higher operating speed than the TTL circuits. If the peripheral circuits are formed by, for example, complementary metal-oxide semiconductor (CMOS) elements, then the Viterbi decoder should be formed by TTL circuits, which have a higher operating speed than the CMOS elements. Fabrication of different types of circuits, such as TTL circuits and ECL circuits or CMOS circuits and TTL circuits, on the same semiconductor substrate, however, overly complicates the manufacturing process.

Further, a Viterbi decoder formed by TTL circuits consumes more power per unit TTL element than the peripheral circuits per unit CMOS element. Also, a Viterbi decoder formed by ECL circuits consumes more power per unit ECL element than the peripheral circuits per unit TTL element.

SUMMARY OF THE INVENTION

An object of the present invention is to provide a Viterbi decoder with improved throughput.

Another object of the present invention is to provide a Viterbi decoder which can be formed by the same type of elements as its peripheral circuits, manufacturing of the overall circuit.

Still another object of the present invention is to provide a Viterbi decoder with decreased power consumption.

To attain the above objects, there is provided, according to the present invention, a Viterbi decoder with a pipeline processing function for decoding a received code sequence transferred from an encoder, including: correlation determining means for calculating correlation between a received code sequence and each of a plurality of predetermined code sequences of known allowable transitions; and selecting means for receiving the correlations and for selecting one of the predetermined code sequences as the maximum likelihood transition. The selected one of the predetermined code sequences has the maximum correlation among the correlations.

A decoded code sequence is obtained from the selected one of the predetermined code sequences. The correlation determining means includes: a plurality of new correlation determining means, each for determining a new correlation based on a newly received code sequence and an already calculated correlation between the already received code sequence and one of the predetermined code sequences; and comparing means for comparing, simultaneously with the determination of the new correlations, already calculated correlations between the already received code sequence and the predetermined code sequences, so as to output a path selecting data. The selecting means selects, in response to the selecting data, one of the predetermined code sequences as the maximum likelihood sequence with respect to the code sequence generated by the encoder.

BRIEF DESCRIPTION OF THE DRAWINGS

The above objects and features of the present invention will be more apparent from the following description of the preferred embodiments with reference to the accompanying drawings, wherein.

DESCRIPTION OF THE PREFERRED EMBODIMENTS

In general, a Viterbi decoder: calculates the correlation between each of a plurality of code sequences of known allowable transitions and a received sequence of a convolutional code; selects one sequence having the maximum correlation with the received sequence from the allowable sequences as the maximum likelihood transition. Decoded data is obtained from the selected one sequence of the allowable transitions.

Figure 1:
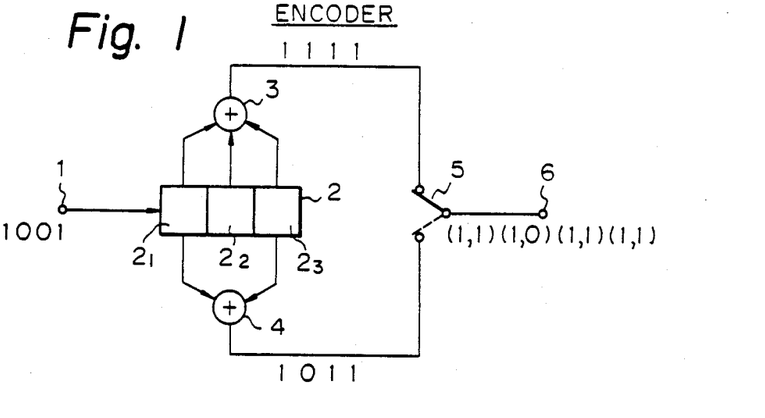
FIG. 1 is a block diagram of a convolutional encoder for explaining a Viterbi algorithm.

The Viterbi decoding algorithm is best understood by considering a simple specific code generated by a convolutional encoder shown in FIG. 1.

FIG. 1 illustrates an example of a convolutional encoder which generates a convolutional code having a constraint length, k, of three (k=3). In FIG. 1, the convolutional encoder includes an input terminal 1, a shift register 2 having three stages $2_1$, $2_2$, and $2_3$, modulo-2 adders 3 and 4, a switch 5 for converting parallel codes into series codes, and an output terminal 6.

As shown, all the information required to determine the pair of output symbols, which are output from the modulo 2 adders 3 and 4 and corresponding to the next input information, is contained in stages $2_2$ and $2_3$ of the shift register plus the input symbol itself applied to the first stage $2_1$. As used in this description, the term "symbol" means a bit. When the next information symbol enters the encoder, the rightmost symbol in the stage $2_3$ is displaced from the encoder and can no longer affect the output symbols. The two symbols contained in the two stages $2_2$ and $2_3$ of the shift register 2 represent the state of the encoder. Thus, the present state and the next information symbol entered into the stage $2_1$ define the next pair of output symbols output from the modulo 2 adders 3 and 4. Since one input information symbol entered into the shift register 2 can affect three pairs of output symbols, the constraint length of the illustrated encoder is three.

For example, consider the encoder to be initially in a state "00" before beginning to encode the sequence 1001. The encoded sequence will be 1101111. This will be described with reference to FIG. 2, which is a trellis diagram of the allowable transition from state to state of the encoder.

Figure 2:
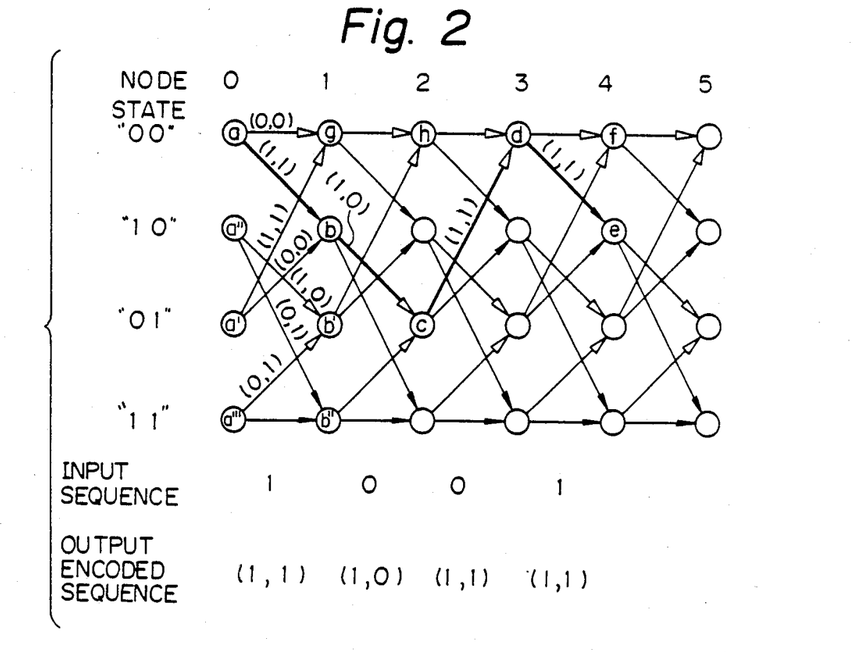
FIG. 2 is a trellis diagram for the convolutional encoder shown in FIG. 1, showing the allowable transitions from state to state.

In FIG. 2, the four states "00", "10", "01", and "11" are identified at the left, i.e., at a node D. The allowable transitions from one state to a subsequent state are shown for a series of nodes 0, 1, 2, 3, . . . progressing from the left to the right, for example, through points a, b, c, d, . . . or a, g, h, d, . . . White arrowheads are used to designate that the next input information symbol was "0", and black arrowheads are used to designate that the next input information symbol was "1".

Starting at the node 0 from the state "00" at a point labelled by notation a, one can progress, as follows: via the black arrowhead corresponding to the first input symbol "1" of the input sequence 1001 to be encoded, to the state "10" at the point b in the node 1, thereby generating the pair of output symbols (1, 1); via the white arrowhead corresponding to the second input symbol "0" to the state "01" at the point c in the node 2 thereby outputting the pair of output symbols (1, 0); via the white arrowhead corresponding to the third input symbol "0" to the state "00" at the point d in the node 3, thereby outputting the pair of output symbol (1, 1); and, then, via the white arrowhead corresponding to the fourth input symbol "1" to the state "10" at the point e in the node 4 thereby outputting the pair of output symbols (1, 1). Thus, the output sequence encoded from the input sequence 1001 in this case is 11101111.

If the input sequence is 000, then the transitions are carried out from the point a via the points g and h to the point d thereby outputting an output sequence 000000.

These processes can be continued as long as desired.

The decoder functions to accept the encoded output sequence from the encoder and to derive, from the encoded output sequence, the original information sequence, i.e., 1001 in the above example.

The essence of the Viterbi decoding algorithm is to study each of the two paths leading to the node j+1 from the node j and to choose that path which is most likely to have been taken by the encoder. This most likely path is retained and the other is discarded.

Figure 3:
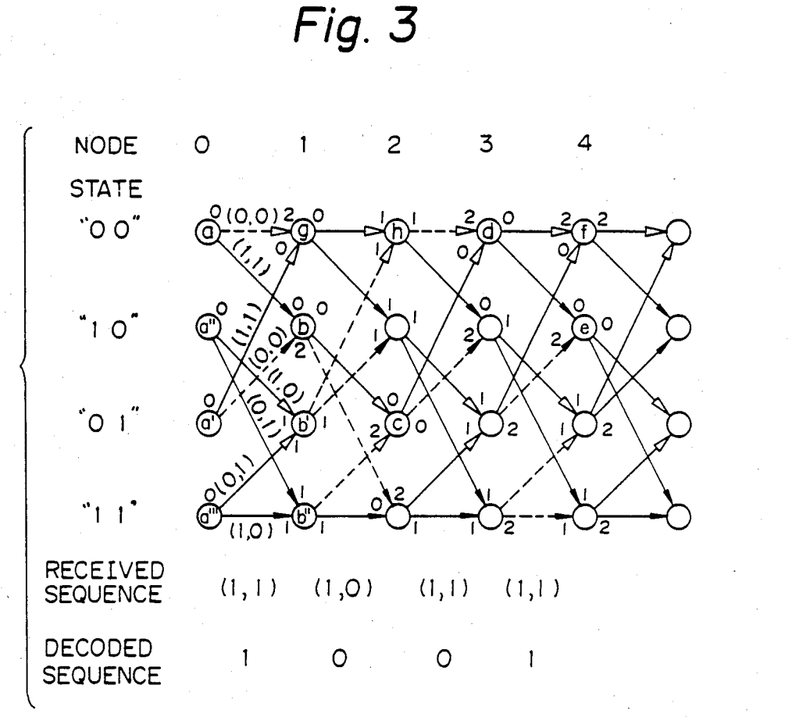
FIG. 3 is a trellis diagram illustrating Viterbi decoding of the signal encoded by the convolutional encoder shown in FIG. 1.

FIG. 3 is a trellis diagram for illustrating Viterbi decoding of the signal encoded by the convolutional encoder shown in FIG. 1. In FIG. 3, the information sequence 1001 was encoded and the corresponding encoder output sequence 11101111. The following discusses the decoding of this sequence. Since the encoder output sequence is used as the decoder input sequence, this example corresponds to noise-free transmission, i.e., no errors to be corrected. Suppose that the decoder knows that the encoder is presently in the state "00" at the node 0. Assume also that the decoder knows that a "path metric", a definition of which will be later described, for each point at the node 0 is zero as indicated at the upper right of each point at the node 0.

A "path metric" is an accumulation of branch metrics along a retained path from one node to another node. A "branch metric" is a Hamming distance between a pair of received symbols during a transition from one node to a subsequent node and a known pair of symbols corresponding to the transition. The only two possible transitions from the state "00" are to the state "00" and to the state "10". From the trellis diagrams, it may be seen that encoder output symbols (00) result from a transition to the state "00" at the point g in the node 1. The received symbols at the decoder input, however, are (1, 1), resulting in a Hamming distance of two. In FIG. 3 a line is drawn from the initial (assumed known) state "00" at the node 0 to the state "00" at the node 1 and a branch metric (two) equal to the Hamming distance between the two received symbols (1, 1) and the two symbols (0, 0) that are known to correspond to this state transition (0, 0) are labeled near the white arrowhead from the point a to the point g. In other words, the decoder hypothesizes that the new state should be the state "00" (which would cause the encoder to generate (0, 0)) but the symbols (1, 1) were actually received so the distance between this chosen hypothesis and the observed received symbols is two. The only remaining way to exit the state "00" is to undergo a transition to the state "10", in which case the encoder must produce the output symbols (1, 1), both of which agree with the received pair of symbols, so the distance between this hypothesis and the observed symbols is zero. Again, in FIG. 3 a line is drawn between the states "00" and "10" and the branch metric (zero) is indicated near the black arrowhead from the state "00" at the node 0 to the state "10" at the node 1.

Similarly, each branch metric is labelled near a respective arrowhead.

Each branch metric at the node 1 is added to the value zero, which had been placed near each point at the node 0, to give a cumulative path metric at the node 1. In every case, the path with the largest cumulative path metric (least likely) is discarded, and the least cumulative path metric is assigned to the end point of the retained path. For example, with respect to the point g, there are two cumulative path metrics, i.e., 2+0=2 and 0+0=0. The path with the largest cumulative path metric of two, from the point a to the point g, is then discarded. Therefore, the remaining cumulative path metric of zero is assigned to the end point g of the path, as labelled at the upper right of the point g. Similarly, to each remaining point in the node 1, the least cumulative path metric is given. In FIG. 3, the states "10", "01", and "11" of the node 1 are respectively given cumulative path metrics of zero, one, and one.

In progressing from the node 1 to the node 2, the received symbols are (1, 0). To make the transition from the state "00" to the state "00", the encoder would generate the symbols (0, 0). The distance between the observed symbols (1, 0) and the symbols that the encoder would generate under this hypothesis (0, 0) is one. Thus, the branch metric from the state "00" at the node 1 to the state 00 at the node 2 is one. This value is added to the value zero which had been placed near the state "00" at the node 1 to give a cumulative metric of one at the node 2, state "00". This same procedure is followed for the three remaining paths linking the nodes 1 and 2.

After progressing m nodes (two in this case), each of $2^m$ states (four in this case) has two means of access. In every case, the path with the largest cumulative metric (least likely) is discarded. These paths are shown as dashed lines. When the two cumulative metrics are equal, either one of the two paths is selected. When progressing from nodes 3 to 4 or beyond, the cumulative metric is calculated by taking the smallest value at the node j and adding to it the branch metric associated with the transition from the hypothesized path from the nodes j to j+1. For example, the two paths leading to the state "10" at the node 3 have cumulative metrics of one and two. The path with metric value two is discarded (dashed line from the state "01") and the path with metric value one is retained (solid line from the state "00").

Suppose this process is terminated at the node 4. The decoder seeks that state with the lowest path metric. In this case it is the state "10" with a path metric of zero. Note that only one unbroken path exists between each state at any node and the origin. Taking the path from the state "10" at the node 4 and working backward, exactly the same path is traced out as was followed by the encoder as shown in FIG. 2. Progressing from left to right in FIG. 3, the decoder output is 1001 which, indeed, was the original encoded sequence.

The above-described decoding is disclosed in the above-mentioned publication "Convolutional Codes and Their Performance in Communication Systems" by A. J. VITERBI.

Figure 4:
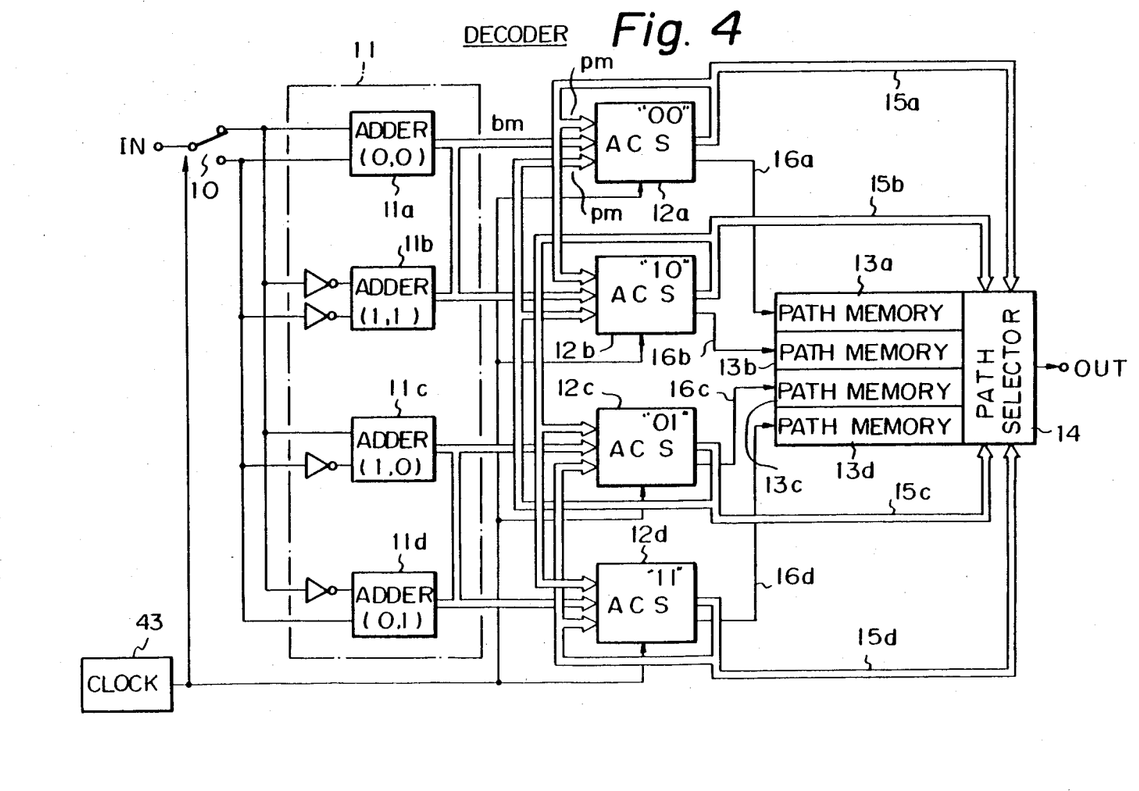
FIG. 4 is a general block diagram of a Viterbi decoder employed by the present invention.

FIG. 4 is a general block diagram of a Viterbi decoder employed by the present invention. In FIG. 4, the Viterbi decoder includes a switch 10, a first correlation determining circuit 11, second correlation determining circuits 12a through 12d, path memories 13a through 13d, a path selector 14, and a clock signal generator 43.

The switch 10 receives in serial format at an input terminal IN, the encoded sequence of codes transmitted from the convolutional encoder shown in FIG. 1, and converts the received codes into parallel codes. The first correlation determining circuit 11 has four branch metric calculating units 11a through 11d. Each of the branch metric calculating units receives a pair of symbols (i.e., a code unit) from the encoder at each decoding clock, and calculates a branch metric bm between the received pair of symbols and a hypothetical path. That is, the branch metric calculating unit 11a calculates a branch metric between the received pair of symbols and a fixed pair of symbols (0, 0) which the encoder would generate by the transition from the state "00" to the state "00". This calculation is effected simply by adding the received pair of symbols. Also, by inverting both of the received pair of symbols and then by adding the inverted symbols, the branch metric calculating unit 11b outputs a branch metric between the received pair of symbols and a fixed pair of symbols (1, 1) which the encoder would generate by the transition from the state "00" to the state "10" or from the state "01" to the state "00" (see FIG. 2). Similarly, the branch metric calculating unit 11c outputs a branch metric between the received pair of symbols and a fixed pair of symbols (1, 0) which the encoder would generate by the transition from the state "10" to the state "01" or from the state "11" to the state "11". The branch metric calculating unit 11d outputs a branch metric between the received pair of symbols and a fixed pair of symbols (0, 1) which the encoder would generate by the transition from the state "10" to the state "11" or from the state "11" to the state "01".

Each of the second correlation determining circuits 12a through 12d includes an adder, a comparator, and a selector. Therefore, they are called ACS circuits. The ACS circuits 12a through 12d respectively calculate path metrics at the state "00", "10", "01", and "11". For example, since the outputs of the ACS circuits 12a and 12c correspond to the allowable transitions to the state "00" of the ACS circuit 12a, the ACS circuit 12a receives already calculated path metrics from the ACS circuit 12a itself corresponding to the state "00," and the ACS circuit 12c corresponding to the state "01" also receives the branch metrics from the branch metric calculating units 11a and 11b which correspond to the allowable transitions. Then, the ACS circuit 12a calculates two path metrics and discards the largest path metric. The least path metric is output on a path metric data line 15a. The path with the retained path metric is determined as the maximum likelihood path, and selection data corresponding to the retained path is transferred through a selection data line 16a to the path memory 13a.

The remaining path memories 13b, 13c, and 13d also store selection signals of survivor paths transferred from the ACS circuits 12b, 12c, and 12d.

The path selector 14 selects a path which has the least path metric among the four path metrics of the selected retained paths. The path selected by the path selector 14 is the maximum likelihood path which is most likely to have been taken by the encoder. Thus, from the path selector 14, a sequence of the decoded outputs is obtained.

Figure 5:
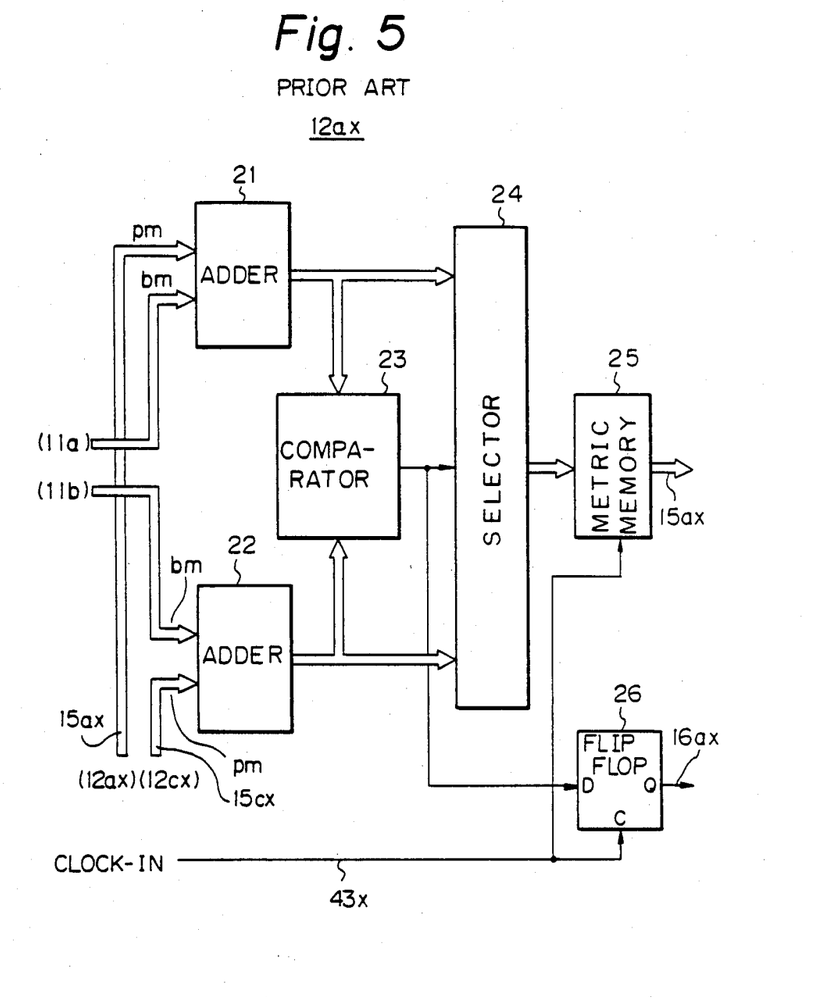
FIG. 5 is a block diagram of a conventional calculating circuit in a conventional Viterbi decoder.

FIG. 5 is a block diagram of a conventional second correlation determining circuit 12ax. The main difference between the Viterbi decoder according to the present invention and a conventional Viterbi decoder resides in the construction of the second correlation determining circuits. In the following, conventional ACS circuits corresponding to the ACS circuits 12a through 12d shown in FIG. 4 are denoted as 12ax through 12dx. Also, conventional units or data lines are denoted by applying the character "x". The block diagram shown in FIG. 4 is also used in the following for explaining the problems in the conventional Viterbi decoder.

In FIG. 5, the conventional ACS circuit 12ax includes two adders 21 and 22, a comparator 23, a selector 24, a metric memory 25, a flip-flop 26, and receives a clock signal on a clock signal line 43X.

The operation of the ACS circuit 12ax during one clock cycle of decoding is as follows. The adder 21 receives a branch metric bm from the branch metric calculating unit 11a and a path metric pm from the output of the ACS circuit 12ax, the path metric pm being the data on the path metric data line 15ax. The adder 22 receives a branch metric bm from the branch metric calculating unit 11b and a path metric pm from the output of the ACS 12cx. The output data, i.e., new path metrics, from the adders 21 and 22 are compared by the comparator 23, which then controls the selector 24 so as to select the smaller path metric. The output of the comparator 23 is also applied to the data input D of the flip-flop 26. In response to a clock signal on the clock signal line 43X, the data applied to the data input D of the flip-flop 26 is set therein so that a path selection signal is output from the output terminal Q of the flip-flop 26. The path metric selected by the selector 24 is written into the metric memory 25 in response to the above-mentioned clock signal. The path metric thus stored in the metric memory 25 is transferred through the path metric data line 15ax. to the path selector 14 (FIG. 4) and to the inputs of the adders 21 and an adder in the ACS circuit 12bx, for the next clock cycle of decoding.

Figure 6A:
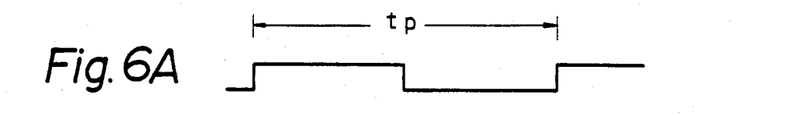
FIGS. 6A through 6C are timing diagrams illustrating the operation and problems of the conventional calculating circuit.
Figure 6B:
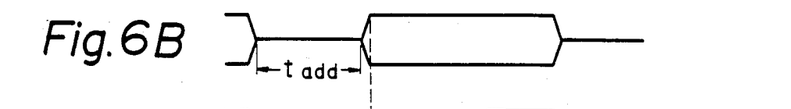
Figure 6C:
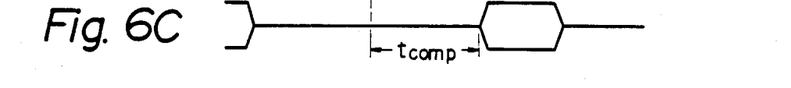

FIGS. 6A through 6C are timing diagrams illustrating the operation and the problems of the conventional ACS circuit 12ax. FIG. 6A represents the clock signal on the clock signal line 43X; FIG. 6B represents the time required for the additions executed by the adders 21 and 22; and FIG. 6C represents the time required for the comparison executed by the comparator 23. As will be seen from the above description of the operation and from FIGS. 6A through 6C, in the conventional ACS circuit 12ax, both the additions and the comparison should be executed during one clock cycle period tp of decoding. Therefore, the clock cycle period tp is substantially determined by the delay times in the adders 21 and 22 and in the comparator 23. In other words, the clock cycle period should be at least greater than the adding time $t_{add}$ plus the comparing time $t_{comp}$. This causes the problems as mentioned before.

A similar discussion can be applied to the remaining ACS circuits 12bx, 12cx, and 12dx (not shown) having similar structures as that of the circuit 12ax.

Figure 7:
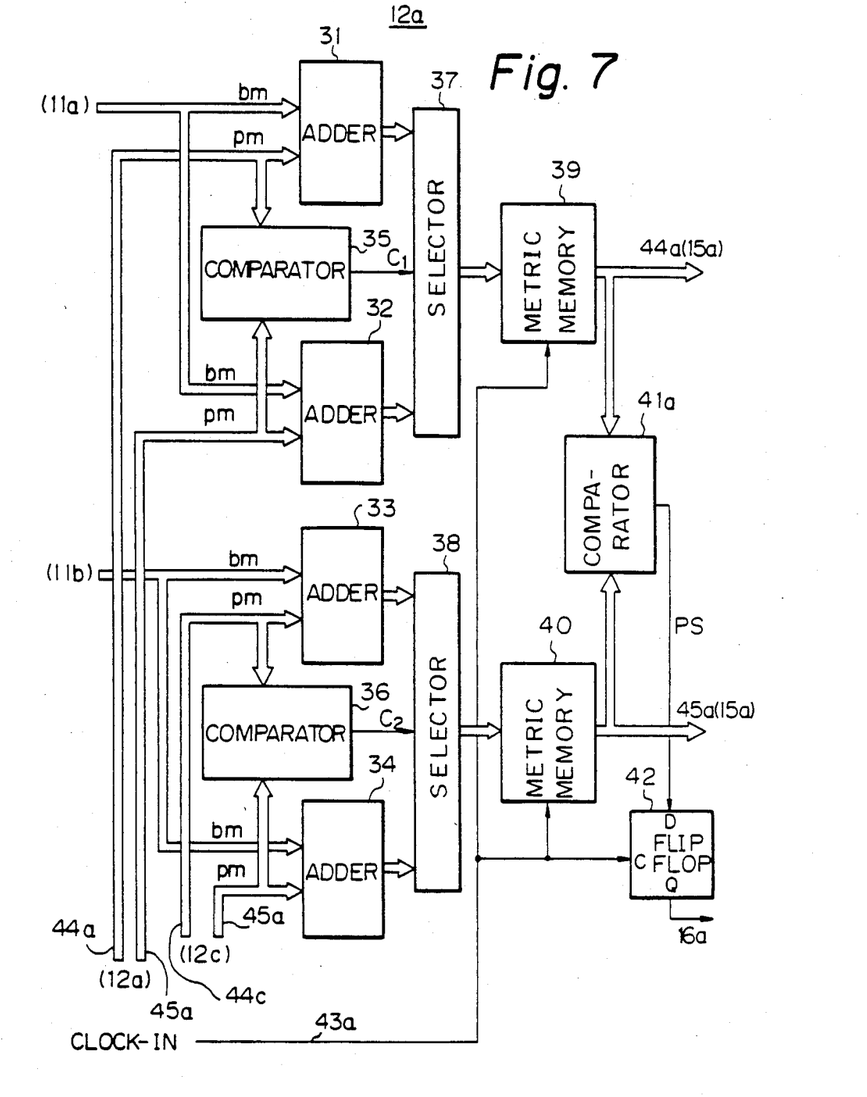
FIG. 7 is a block diagram of a calculating circuit included in the Viterbi decoder shown in FIG. 4, according to a first embodiment of the present invention.

FIG. 7 is a block diagram of an ACS circuit 12a included in the Viterbi decoder shown in FIG. 4, according to a first embodiment of the present invention. The remaining ACS circuits 12b, 12c, and 12d are not shown in the drawing, but these are similar in structure to the illustrated ACS circuit 12a. In FIG. 7, the ACS circuit 12a includes four adders 31 through 34, two comparators 35 and 36, two selectors 37 and 38, two metric memories 39 and 40, a comparator 41, and a flip-flop 42.

Figure 8A:
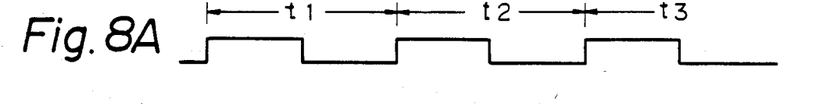
FIGS. 8A through 8F are timing diagrams illustrating the operation of a calculating circuit according to a first embodiment of the present invention.
Figure 8B:
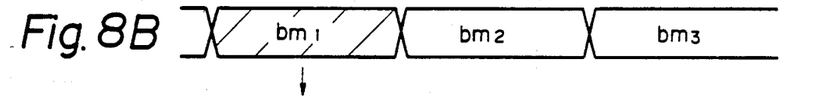
Figure 8C:
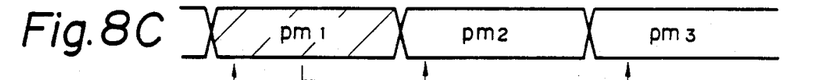
Figure 8D:
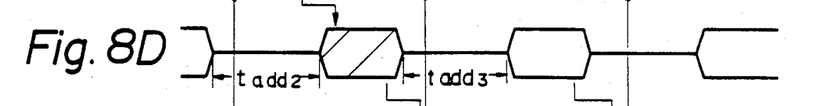
Figure 8E:
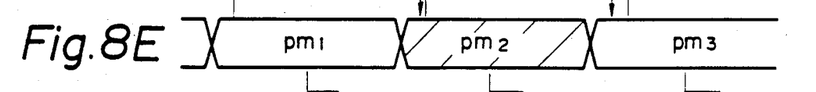

FIGS. 8A through 8F are timing diagrams illustrating the operation of the ACS 12a shown in FIG. 7. Referring to FIGS. 7 and 8, during a clock cycle period t1 of a clock signal shown in FIG. 8A, the ACS circuit 12a receives branch metrics bm1, as shown in FIG. 8B, from the branch metric calculating units 11a and 11b (FIG. 4). The branch metric from the branch metric calculating unit 11a is equal to the Hamming distance between the pair of symbols received, during this clock cycle period $t_1$, at the input terminal IN of the Viterbi decoder (FIG. 4) and the fixed pair of symbols (0, 0). The branch metric from the branch metric calculating unit 11b is equal to the Hamming distance between the above-mentioned received pair of symbols and the fixed pair of symbols (1, 1). These fixed pairs of symbols (0, 0) and (1, 1) correspond to the allowable paths to the state "00" to which the ACS circuit 12a corresponds. Also, during the period t1, the ACS circuit 12a receives the path metrics pm1, as shown in FIG. 8C, from the path metric data lines 44a and 45a, which are represented in FIG. 4 by the reference 15a connected to the output of the metric memories 39 and 40 in the ACS circuit 12a and from the path metric data lines 44c and 45c. connected to the output of the two metric memories (not shown) in the ACS circuit 12c. During this period t1, the metric memories store the path metrics pm1 as shown in FIG. 8E which had been calculated and selected during the clock cycle period just before the clock cycle period t1. The adder 31 adds, during a period $t_{add2}$ in this period t1, the received branch metric from the branch metric calculating unit 11a and the path metric from the path metric data line 44a, as shown in FIG. 8D. Similarly, the adders 32, 33, and 34 respectively add the received branch metrics and the received path metrics, during the period $t_{add2}$.

Figure 8F:
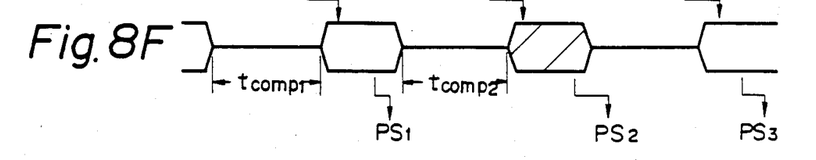

Simultaneous with these additions during the period t1, the comparator 35 compares, as shown in FIG. 8F, the path metrics pm1 stored in the metric memories 39 and 41, with the result that the comparator 35 generates a control signal $C_1$ which is applied to the selector 37. In response to the control signal $C_1$, the selector 35 selects either one of the two respective values generated by the adders 31 and 32. Note that the adders 31 and 32 receive the same branch metric bm1. This comparing operation is carried out during a period $t_{comp1}$ in the period t1, as shown in FIG. 8F. The selected value is smaller than the remaining of the two values. The selected value is then written, as shown in FIG. 8C, as the next path metric pm2 into the metric memory 39 in response to the next clock signal generated by the clock signal generator 43 (FIG. 4), and then transferred in response to a clock signal on line 43a during the subsequent clock cycle period $t_2$.

The comparator 36, the selector 38, and the metric memory 40 operate in a manner similar to the above-mentioned operation of the comparator 35, the selector 37, and the metric memory 39.

Also simultaneous with these comparisons by the comparators 35 and 36 during the period t1, the comparator 41 compares the two path metrics pm1 stored in the metric memories before updating of these memories with the new path metrics pm2. As a result of the comparison by the comparator 41, path selecting data is applied to the data input D, of the flip-flop 42. The generated path selecting data corresponds to the path having the smaller of the path metrics pm1 stored in the metric memories 39 and 40 during this period t1. In response to the clock signal generated during the period t1, the path selecting data corresponding to the path having the smaller of path metrics pm1 is latched in the flip-flop 42. Thus, as shown in FIG. 8F, during the period t1, the path selecting data PS$_1$, indicating which of the two paths having the path metrics pm1 is selected, is transferred from the Q output of the flip-flop 42 through the signal line 16a to the path memory 13a (FIG. 4).

During the subsequent clock cycle period t2, the comparators 35, 36, and 41 compare the path metrics pm2, with which the metric memories 39 and 40 have been updated in response to the clock signal generated during this period t2, so as to generate path selecting data PS$_2$ (FIG. 8, (f)) in a manner similar to the above-mentioned operation during the period t1.

The same procedure is followed for the subsequent clock cycle periods, for example, t3 and t4, . . .

It should be noted that, during the clock cycle period t2 for example, the comparing operation by the comparator 41a is carried out in the period $t_{comp2}$; and the adding operations by the adders 31 through 34 are carried out in the period $t_{add3}$. The period $t_{comp2}$ is used for generating the selecting data PS$_2$ indicating which of the two paths having path metric pm2 has been selected. The period $t_{add3}$, however, is used for obtaining the path metrics pm3 which will be stored in the metric memories during the subsequent period t3. The period $t_{comp2}$ and the period $t_{add3}$ are substantially simultaneous. The additions for obtaining the path metrics pm2 are carried out in the period $t_{add2}$ of the previous clock cycle period t1. Thus, as illustrated by slash lines in FIG. 8, the addition and the comparison are carried out in a pipeline processing manner so that process follows the illustrated arrows during the two clock cycle periods t1 and t2, with the result that the path selecting data PS$_2$ is output and stored into the path memory 13a (FIG. 4).

On the contrary, in the conventional ACS circuit 12ax, as illustrated in FIGS. 6A through 6C, the additions and the comparison for outputting path selecting data are carried out within the same clock cycle period tp, and the comparison is carried out only after the end of the additions.

Therefore, assume that the speed of each addition or each comparison is the same for the conventional ACS circuit 12ax as it is for the ACS circuit 12a of the present invention. Then, one clock cycle period for example, t1 in the ACS circuit 12a of the present invention, can be much shorter than the clock cycle period tp in the conventional ACS circuit 12ax.

Figure 9:
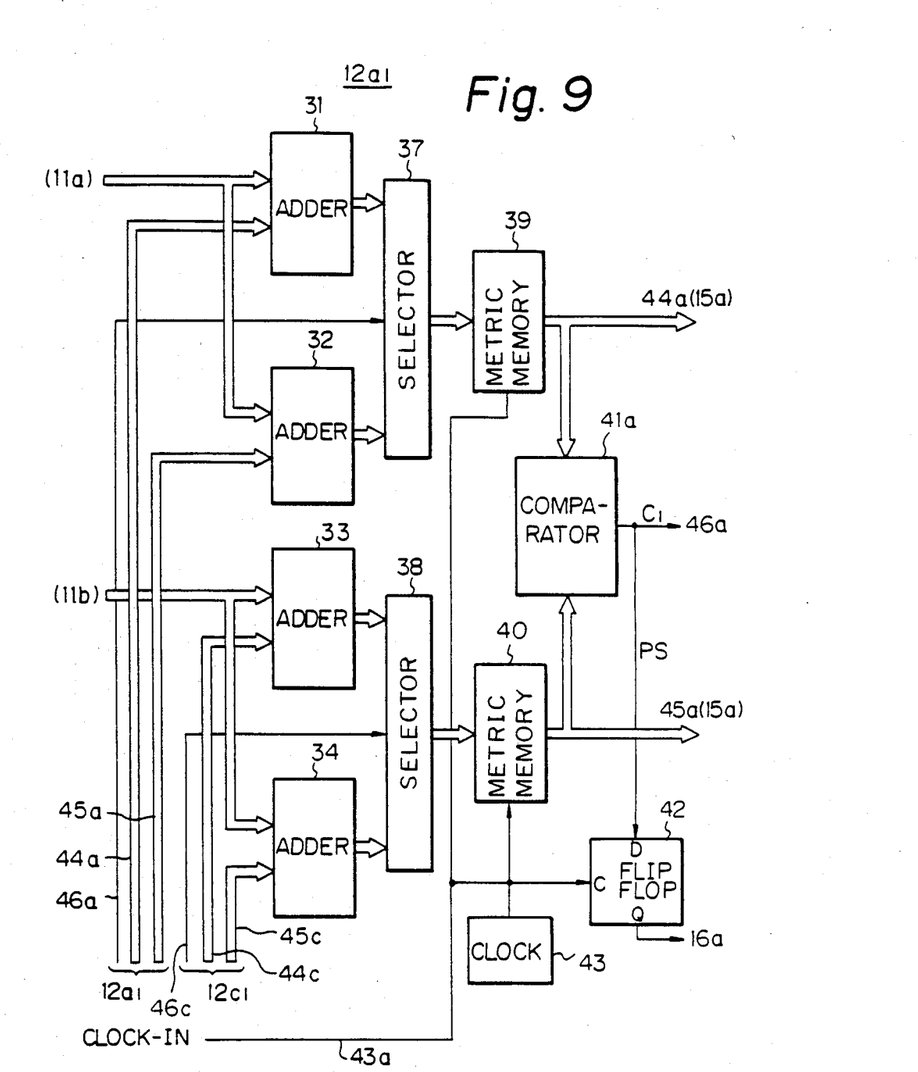
FIG. 9 is a block diagram of a calculating circuit included in the Viterbi decoder shown in FIG. 4, according to a second embodiment of the present invention.

FIG. 9 is a block diagram of an ACS circuit according to a second embodiment of the present invention. In this embodiment, only one comparator is employed in the ACS circuit 12a1. In other words, the comparators 35 and 36 shown in FIG. 7 are omitted in FIG. 9. The other portions are substantially the same as those in the calculating circuit 12a1, and are labelled with the same reference symbols.

The path selecting data PS$_1$, PS$_2$, . . . generated by the comparator 41 during respective clock cycle periods t1, t2, t3, . . . is applied as control signals C1 to the selector 37.

Omission of the comparator 35 in FIG. 7 is possible because, during a comparison period, for example, $t_{comp2}$ shown in FIG. 8, the comparator 41a (FIG. 9) and the comparator 35 (FIG. 7) compare the same data, i.e., the path metrics pm2. Also, because the comparator 36 (FIG. 7) and a comparator 41c (not shown) FIG. 9 in the ACS circuit 12c operate to compare the same data within the same comparing period, the comparator 36 can be omitted.

The operation of the ACS circuit 12a1 is substantially the same as the operation of the ACS circuit 12a, except that, in place of the comparators 35 and 36 in FIG. 7, the comparator 41a and the comparator 41c (not shown) provide the control signals C1 and C2.

As is well known, the encoded code has a rate (code ratio) R determined by:

$$R = b/n$$

where b is the number of symbols of the data sequence allowed to be input into the encoder during one clock cycle period, and n is the number of symbols allowed to be output from the encoder during one clock cycle period. The larger the code ratio R, the higher the data transfer rate, but the error correction performance deteriorates. The convolutional encoder shown in FIG. 1 has a code ratio R = $\frac{1}{2}$. The present invention, however, is not restricted to decoding a code having the above code ratio, but may be applied to decode various codes having different code ratios.

From the foregoing description, it is apparent that, according to the present invention, comparisons of path metrics, which had been obtained by additions during the preceding cycle, are carried out simultaneously with additions by adders during the current decoding cycle. Therefore, the additions and the comparisons are carried out in a pipeline processing manner. As a result, the throughput of the Viterbi decoder according to the present invention is greatly improved over the conventional Viterbi decoder. This enables the manufacture of a Viterbi decoder having the same type of elements as the peripheral circuits; facilitating the manufacturing process and; lowers the power consumption of the circuit.

We claim:

1. A Viterbi decoder with a pipeline processing function for decoding received code sequences transferred from an encoder, comprising:
    correlation determining means for receiving a code sequence and for calculating correlations between received code sequences and each of a plurality of predetermined code sequences; and
    first selecting means, operatively connected to receive said correlations, for selecting one of said predetermined code sequences as a maximum likelihood sequence, the selected one of said predetermined code sequences having the maximum correlation among said correlations, and for obtaining a decoded code sequence from said selected one of said predetermined code sequences, wherein said correlation determining means comprises:
    new correlation determining means for determining a new correlation based on a first received code sequence and a previously calculated correlation between a previously received code sequence and one of said predetermined code sequences; and
    comparing means for comparing, simultaneously with the determination of the new correlations, previously calculated correlations between the previously received code sequence and said pretermined code sequences, and for providing path selection data;

second selecting means, operatively connected to said new correlation determining means and said comparing means, for selecting in response to said path selection data, one of said new correlations from said new correlation determining means, such that the selected new correlation has the maximum correlation among said new correlations applied to said second selecting means;

said first selecting means selecting, in response to said selecting data, one of said predetermined code sequences as the maximum likelihood sequence with respect to the code sequence generated by the encoder.

2. A Viterbi decoder with a pipeline processing function for decoding received code sequences each comprising code units and being transferred from an encoder having a plurality of states, comprising:

clock signal generator means for generating a clock signal having predetermined clock cycle periods;

first correlation determing circuit means for obtaining, during each of said clock cycle periods, a plurality of first correlations (bm) between a unit of a received code sequence and a plurality of fixed units of predetermined code sequences, each fixed unit corresponding to a predetermined path from one state to a subsequent state of said encoder when said encoder generates one of said predetermined code sequences;

second correlation determining means for obtaining, during each of said clock cycle periods, a plurality of second correlations (pm), each of said correlations being determined based on a corresponding one of said first correlations and at least two previously calculated second correlations, said previously calculated second correlations being calculated during a clock cycle period immediately preceeding the current clock cycle period; and first selecting means for selecting one of said predetermined code sequences, said selected predetermined code sequence having the maximum correlation of said plurality of second correlations, and for obtaining a decoded code sequence from said selected code sequence; wherein each of said second correlation determining includes comparing means for comparing, during each of said clock cycle periods, said previously calculated second correlations and for providing path selecting data, said path selecting data corresponding to the maximum correlation of said previously calculated second correlations, and being applied to said first selecting means, such that said first selecting means selects one of said predetermined code sequences in response to said path selecting data; adding means for adding, during each of said clock cycle periods, one of said first correlations (bm) to one of said previously calculated second correlations and for generating a new second correlation in accordance with the addition;

second selecting means for selecting, in response to said path selecting data, one of said new second correlations, the selected new second correlation having the maximum correlation of said second correlations; and updating means for updating said previously calculated second correlations in accordance with said selected new second correlations and during a clock cycle period subsequent to the clock cycle period during which said previously calculated second correlations are compared simultaneously with the addition of said first correlations to said previously calculated second correlations.

3. A Viterbi decoder as set forth in claim 2, wherein said code units each comprise a received pair of symbols; said fixed units of said predetermined code sequences comprise four pairs of symbols (0, 0), (1, 1), (1, 0), and (0, 1); said first correlations correspond to branch metrics; and said first correlation determining means comprises first branch metric calculating means for calculating a first branch metric equal to a Hamming distance between said received pair of symbols and the first one of said fixed units (0, 0);

second branch metric calculating means for calculating a second branch metric equal to a Hamming distance between said received pair of symbols and the second one of said fixed units (1, 1);

a third branch metric calculating means for calculating a third branch metric equal to a Hamming distance between said received pair of symbols and the thrid one of said fixed units (1, 0); and fourth branch metric calculating means for calculating a fourth branch metric equal to a Hamming distance between said received pair of symbols and the fourth one of said fixed unit (0, 1).

4. A Viterbi decoder as set forth in claim 3, wherein said second correlations correspond to path metrics and each represents a cumulative correlation between said received code sequence and one of said predetermined code sequences, such that the path metric and the correlation vary inversely.

5. A Viterbi decoder as set forth in claim 4, wherein said encoder has a plurality of states and a set of allowable transitions between said states of said encoder, said branch metric calculating means each being associated with one of the allowable transitions, said encoder further comprising:

four of said second correlation determining means respectively associated with four of said encoder states "00", "10", "01", and "11" and with respective ones of the allowable transitions, each of said second correlation determining means operatively connected to receive two branch metrics from two of said branch metric calculating means corresponding to the allowable transitions to the state associated with said second correlation determining means, and to receive two previously calculated path metrics from two of said second correlation determining means corresponding to the allowable transitions to the state associated with said second correlation determining means.

6. A Viterbi decoder as set forth in claim 5, wherein said updating means comprises:

metric memory means, operatively connected through said second selecting means to said adding means, for storing said new path metric selected by said second selecting means in response to a clock signal generated by said clock signal generator means, said adding means and said comparing means cooperate to calculate said new path metric during a clock cycle period just prior to said new path metrics being stored in said metric memory means.

* * * * *